United States Patent [19]
Fletcher et al.

[11] Patent Number: 5,241,221
[45] Date of Patent: Aug. 31, 1993

[54] CMOS DRIVER CIRCUIT HAVING REDUCED SWITCHING NOISE

[75] Inventors: Thomas D. Fletcher, Orem; Edward A. Burton, Provo, both of Utah; Benny T. Ma, San Jose, Calif.

[73] Assignee: North American Philips Corp., Signetics Div., Sunnyvale, Calif.

[21] Appl. No.: 976,725

[22] Filed: Nov. 16, 1992

Related U.S. Application Data

[63] Continuation of Ser. No. 861,169, Mar. 27, 1992, abandoned, which is a continuation of Ser. No. 548,788, Jul. 6, 1990, abandoned.

[51] Int. Cl.$^5$ .................. H03K 5/12; H03K 6/04; H03K 17/16; H03K 19/003
[52] U.S. Cl. ................. 307/263; 307/443; 307/451; 307/572; 307/594
[58] Field of Search .......... 307/263, 443, 448, 451, 307/469, 475, 542, 594, 572

[56] References Cited

U.S. PATENT DOCUMENTS

| | | | |
|---|---|---|---|
| 4,408,135 | 10/1983 | Yuyama et al. | 307/451 |
| 4,570,091 | 3/1984 | Yasuda et al. | 307/451 |
| 4,719,369 | 1/1988 | Asano et al. | 307/451 |
| 4,731,553 | 3/1988 | Van Lehn et al. | 307/451 |
| 4,749,882 | 6/1988 | Morgan | 307/451 |
| 4,779,013 | 10/1988 | Tanaka | 307/451 |
| 4,785,203 | 11/1988 | Nakamura | 307/451 |
| 4,789,796 | 12/1988 | Foss | 307/443 |
| 4,818,901 | 4/1989 | Young et al. | 307/451 |
| 4,829,199 | 5/1989 | Prater | 307/451 |
| 4,855,623 | 8/1989 | Flaherty | 307/451 |
| 4,890,017 | 12/1989 | Masuda et al. | 307/443 |
| 4,894,560 | 1/1990 | Chung | 307/451 |
| 4,959,565 | 9/1990 | Knecht et al. | 307/594 |
| 4,975,598 | 12/1990 | Borkar | 307/451 |
| 4,985,644 | 1/1991 | Okihara et al. | 307/443 |
| 5,057,711 | 10/1991 | Lee et al. | 307/443 |
| 5,121,013 | 6/1992 | Chuang et al. | 307/572 |

*Primary Examiner*—William L. Sikes
*Assistant Examiner*—Terry D. Cunningham
*Attorney, Agent, or Firm*—David Schreiber

[57] ABSTRACT

In a driver circuit, high- and low-impedance drive means (26 and 28 respectively) operate in parallel to effect a desired output transition. Adaptive control means 32 respond to a threshold value of the output signal (VO) and turn off the low-impedance drive means in the course of the output transition. The low initial output impedance of the driver circuit effects rapid charging of a line capacitance CL, while toward the end of the output transition the higher output impedance of the driver circuit more closely matches the input impedance ZL of a load circuit. This higher impedance dampens ringing and thereby reduces induced supply line noise which is conventionally associated with high-speed driver circuits.

15 Claims, 3 Drawing Sheets

CMOS DRIVER CIRCUIT HAVING REDUCED SWITCHING NOISE

This is a continuation of application Ser. No. 07/861,169, filed Mar. 27, 1992, now abandoned, which is a continuation of parent application Ser. No. 07/548,788, filed Jul. 6, 1990, abandoned.

FIELD OF THE INVENTION

The invention relates to a driver circuit for causing a desired output transition in an output signal in response to a corresponding input transition in an input signal.

BACKGROUND ART

Such driver circuits are used in low power digital circuits, in particular integrated circuits, to interface to higher power circuitry, or via interconnections to circuitry on another circuit board, another integrated circuit chip, or even within the same chip. The effective load is therefore typically characterized by a load circuit impedance ZL in parallel with a large capacitance CL of the interconnections, as illustrated at the output of a conventional driver circuit in FIG. 1. The circuit of FIG. 1 may be constructed for example in complementary MOS (CMOS) technology. Two inverters 10 and 12 in cascade form the driver circuit, receiving an input signal VI on an input line 18 and generating a corresponding output signal VO across the load on an output line 20.

FIG. 2, curve (a) shows a high-to-low transition in the input signal VI while FIG. 2, curve (b) shows the output transition in VO which results after a few nanoseconds propagation delay. In order that the output transition may occur at high speed, the inverter 12 is constructed using large transistors to give the circuit a low output impedance so that it may discharge the capacitance CL rapidly by conducting a large output current 10. Unfortunately, the line capacitance CL and inductances L1–L3 in the output line 20 and the supply lines 14 (VCC) and 16 (GND) respectively form a resonant circuit, and the low output impedance enables the output signal VO to overshoot the desired low level (GND) and to continue "ringing" (oscillating around the desired level) for several cycles. This ringing is a noise source which can lead to spurious transitions being detected by the load circuit and by nearby circuits connected to the same supply lines. Consequently, the designer of a conventional driver circuit is forced to accept a compromise between switching speed and switching noise.

In FIG. 3, curve (a) illustrates the ground supply current IGND drawn by the inverter 12 from the supply line 16 (GND) during the transition. In addition to a large peak of supply current (at F), reflecting the large output current required to discharge the load capacitance, the ringing is reflected in a series of peaks in the current IGND, which represent a considerable waste of power (generating heat), as well as being a source of noise. FIG. 3, curve (b) shows the supply current IVCC drawn from the positive supply VCC. This current IVCC is not large during the high-to-low output transition illustrated, but in the case of the complementary (low-to-high) transition, the roles of IVCC and IGND will be substantially reversed.

The problem of switching noise in outputs and supply lines is a general one, but is particularly acute in circuit technolgies such as CMOS, where the output driving is provided by insulated gate field effect transistors (including, for example, MOS transistors). Such devices when turned on act very much like simple resistors, lacking the rectifying properties of bipolar transistors.

SUMMARY OF THE INVENTION

It is an object of the invention to enable the provision of a driver circuit allowing high speed operation without a corresponding increase in noise.

The invention provides a driver circuit for causing a desired output transition in an output signal in response to a corresponding input transition in an input signal, characterized in that the circuit comprises adaptive control means for varying an output impedance of the driver circuit adaptively in response to the output signal as the output transition progresses. By using feedback of the actual output signal value to modify the output impedance of the driver circuit during the transition, the various parameters of speed, noise, power dissipation and so forth can be improved without the compromises that are a feature of conventional driver circuits.

For example, the adaptive control means may be arranged to increase the output impedance as the output transition progresses. A low initial output impedance provides a large initial output current fast charging of the load capacitance, while a higher impedance towards the end of the transition helps to dampen ringing. Thus higher speed can be achieved without the corresponding increase in noise associated with conventional circuits.

Such a driver circuit may comprise first and second drive means responsive to the input signal, while the adaptive control means comprise means for deactivating the second drive means in response to the output signal crossing a threshold value in the course of the output transition. This provides a simple embodiment, particularly suitable for implementation in CMOS technology.

The first and second drive means may comprise high- and low-output impedance drive means respectively. The second drive means, or both in parallel, can be optimized to effect rapid charging of the line capacitance, while the output impedance of the first drive means can be adapted to that of the load circuit so as to reduce ringing.

It may be noted that U.S. Pat. No. 4,421,994 provides a driver circuit in which a low impedance drive means is activated to achieve fast transition and then deactivated after a short delay. It should be appreciated, however, that in that earlier circuit the delay is fixed at a value which is guaranteed to exceed the time taken for the output transition. The sole aim of this measure in the circuit of U.S. Pat. No. 4,421,994 is to limit the power dissipation to a safe level in the event of a short circuit at the output of the driver. The problems of impedance mismatch and noise are not addressed, and feedback of the actual output signal to control output impedance during the transition is not countenanced.

The adaptive control means may comprise a transmission gate for coupling the input signal to the second drive means and adaptive delay means for coupling the input signal to a gating input of the transmission gate in response to the output signal crossing the threshold value. In such an embodiment the first drive means may also form the adaptive delay means.

The second drive means may comprise a transistor having its main current path connected between a supply terminal and an output terminal of the driver circuit, which output terminal carries the output signal, and clamping means may be arranged to turn off the transistor actively in response to the output signal crossing said threshold value. The output impedance due to the second drive means can be set to a desired value by choosing suitable dimensions for the transistor.

The first and/or the second drive means may comprise distributed drive means whereby at least a part of the drive means is activated with a small delay so as to reduce the rate of change of a current flowing in the circuit during the output transition. This measure can reduce the level of noise caused by supply line inductances.

The driver circuit may further comprise complementary drive means for effecting a complementary output transition of the output signal in a direction opposite to that of the first mentioned output transition. The complementary drive means may also feature adaptive impedance control by means similar to those described above, if desired. The impedances, threshold values and other parameters can be made the same or different in the different transition directions, to suit the line and load impedances.

BRIEF DESCRIPTION OF THE DRAWINGS

Embodiments of the invention will now be described, by way of example, with reference to the accompanying drawings, in which.

DESCRIPTION OF THE EMBODIMENTS

Figure 1:
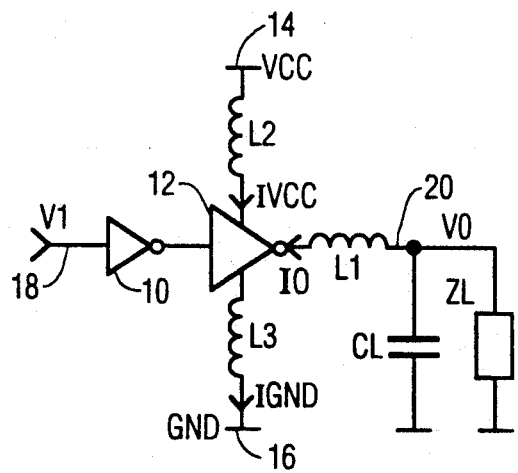
FIG. 1 shows in block schematic form a conventional driver circuit and typical load for such a circuit.
Figure 2:
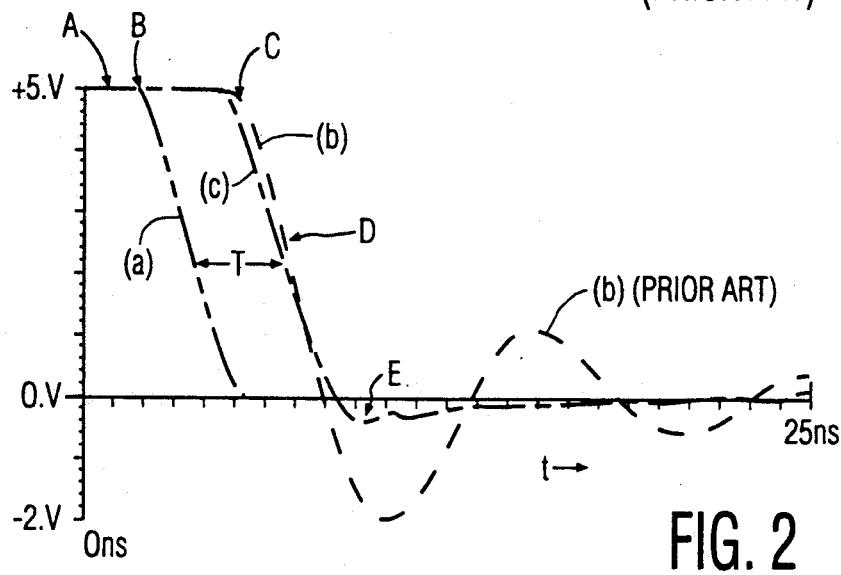
FIG. 2 shows input and output voltages of the conventional driver of FIG. 1 and a driver circuit embodying the invention in the course of a single transition.
Figure 3:
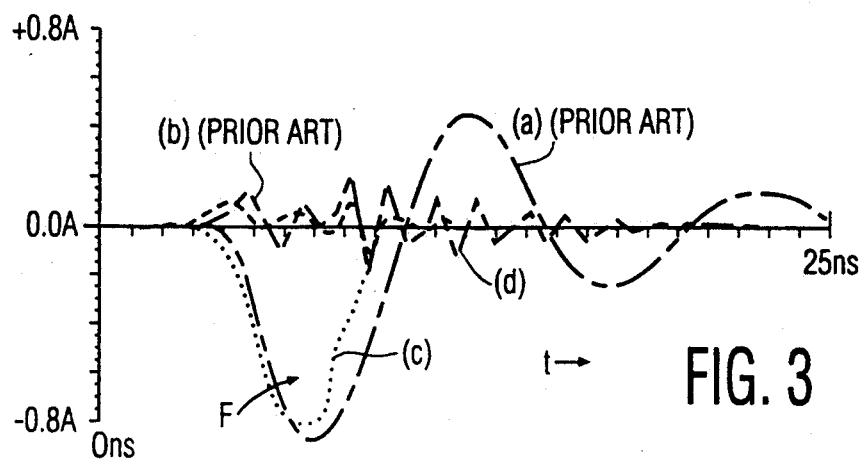
FIG. 3 shows supply current variations for the conventional driver of FIG. 1 and the driver circuit embodying the invention during the same transition.

The driver circuit of FIG. 1, and the signals represented in FIG. 2, curves (a) and (b) and FIG. 3, curves (a) and (b) have already been described above and identified as belonging to the prior art.

Figure 4:
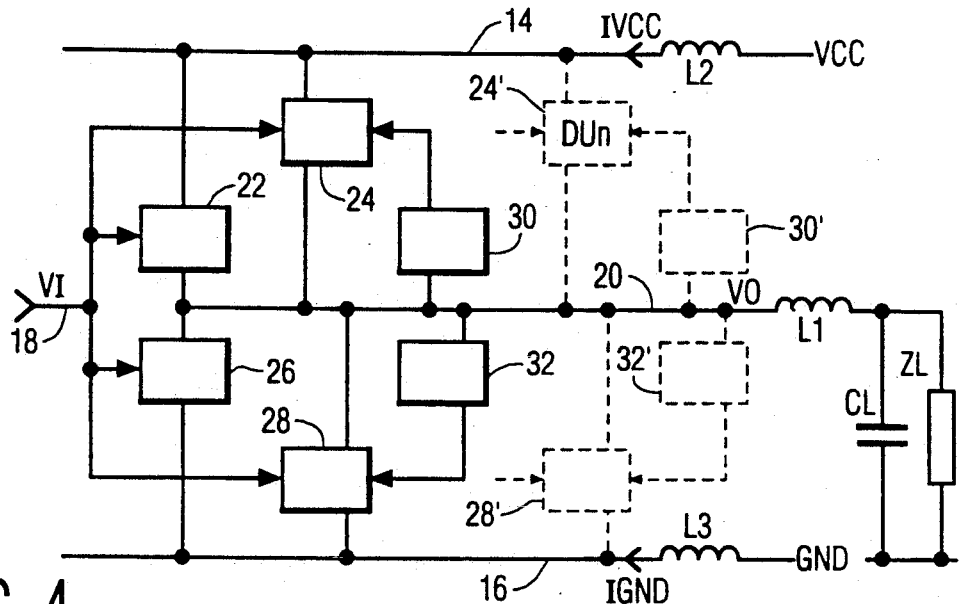
FIG. 4 shows in block schematic form a bidirectional driver circuit embodying the invention.

FIG. 4 shows in block schematic form a driver circuit incorporating adaptive control of its output impedance, for use in place of the conventional driver circuit of FIG. 1. Power supply lines 14 and 16 are provided to receive the supply voltages VCC and GND respectively, while input and output lines 18 and 20 respectively carry the input signal VI and the output signal VO respectively. First and second high-side drive means 22 and 24 are connected in parallel between the supply line 14 (VCC) and the output line 20 (VO) and each has a control input connected to the input line 18 (VI). First and second low-side drive means 26 and 28, complementary to the high-side drive means, ar connected in parallel between the output line 20 (VO) and the GND line 16, and each similarly has a control input connected to the input line 18 (VI).

A high-side feedback device 30 has an input connected to the output line 20 (VO) and an output connected to a further control input of the second high-side drive means 24, while a low-side feedback device 32 has an input connected to the output line 20 and an output connected to a further control input of the second low-side drive means 28. Each feedback device 30 and 32 embodies adaptive control means for the high-side and low-side drive means, respectively.

In operation, each of the drive means 22 to 28 may be considered as a switch which will be open or closed depending on the logical value of the input signal VI which is applied to its control input. Assuming that a non-inverting driver circuit is desired, the high-side switches 22 and 24 will close when VI goes high (towards VCC), thereby connecting the output line 20 (VO) to VCC. The low-side switches 26 and 28, on the other hand, will close when VI goes low (towards GND), thereby conducting output current IO between the output line 20 (VO) and GND. Each switch has a characteristic impedance when closed, which may be referred to as its on-resistance RON, and which limits its contribution to the output current in accordance with Ohm's Law.

When both high-side switches 22 and 24 are on (closed), and low-side switches 26 and 28 are off (open), then the output impedance of the driver circuit is the value of RON(22) in parallel with RON(24), represented herein as RON(22) || RON(24). Output current IO can thus flow in two parallel portions through the switches 22 and 24, the relative size of these portions being dependent on the ratio of RON(22):RON(24). The first high-side switch 22 remains on at all times when VI is high, but the high-side feedback device 30 is able, via the further control input of the second high-side switch 24, to override the effect of VI and turn off the switch 24 in response to changes in the output signal VO. When this happens, the output impedance of the driver circuit is increased to RON(22), as only switch 22 remains able to conduct the output current IO. In a similar manner, when VI is low, the low-side feedback device 32 is able to turn off the second low-side switch 28, thereby increasing the output impedance of the circuit from RON(26) || RON(28) to RON(26).

Therefore the circuit of FIG. 4 can be designed to alter its own output impedance between at least two different values depending on the actual value of the output signal VO. A particular application of this ability is in driving the type o load identified in the introduction in which a large line capacitance CL appears in parallel with a load circuit impedance ZL.

Consider for the sake of example a high-to-low transition as described above for the conventional driver with reference to FIGS. 2 and 3. In the circuit of FIG. 4, RON(26) can be made a relatively high impedance to match ZL, while RON(28) can be such that RON(26)-|| RON(28) is a low value optimized for rapid discharging of the line capacitance CL from VCC towards GND (large output current IO). If the low-side feedback device 32 is designed to respond to a certain threshold value of VO somewhere between VCC and GND, then the following sequence of events will ensure that VO follows the graph of curve (c) in FIG. 2.

At time A, before the transition begins, the high impedance high-side switch 22 is held on by the input signal VI being high, while the low-side switches 26 and 28 are held off. The line capacitance CL and the load circuit impedance ZL are charged to VCC and output signal VO is high. The low impedance high-side switch 24 is therefore held off by feedback device 30.

The high-to-low input transition begins at B, and, after a propagation delay T, the low-side switches 26 and 28 are turned on by the low value of VI while the high-side switch 22 is turned off. This low impedance connection to GND begins the rapid discharge of the line capacitance CL, and so the output signal VO begins its downward transition at C.

At D, the output signal VO reaches the threshold value required to activate the low-side feedback device 32, and the low impedance low-side switch 28 is turned off again. By this time, the line capacitance CL is substantially discharged, and the transition is completed by the high impedance switch 26 alone. Since RON(26) is matched more closely to the load circuit impedance ZL, approximately critical damping is effected rather than the underdamping present in the conventional driver. The output signal VO therefore settles quickly to the desired value (GND in this example) with only minimal overshoot (at E) and no ringing. FIGS. 3(c) and (d) show the variations of IVCC and IGND respectively during the course of the transition just described. It can be seen that the main peak in IGND (at F) has an area less than that for the known circuit (FIG. 3, curve (a)). Since the output transition is achieved at least as quickly as by the known circuit, this indicates a more efficient use of power. Also, the subsidiary peaks in IGND are virtually absent due to successful damping out of the ringing.

The threshold value of VO at D can be chosen to suit the circumstances, in particular it is generally desirable that VO should have reached any input threshold value of the load circuit before the low impedance switch turns off, to ensure that the information represented by the transition is received reliably.

The operation of the circuit in the case of a subsequent low-to-high transition will be exactly as described above, but with the roles of the high-side elements (22, 24, 30) and the low-side elements (26, 28, 32) reversed. The threshold value for the high-side feedback device 30 need not be the same as that for the low-side feedback device 32.

FIG. 4 also shows in broken lines further high-side and low-side drive means 24' and 28', each with an associated feedback device 30' or 32'. In principle, any number of drive means can be connected in parallel and activated or deactivated by feedback devices in the course of the output transition, thereby achieving an output impedance which is a more complex function of VO than the simple two-value function described above. In alternative embodiments, a single drive means may have its on-resistance continuously modulated by feedback of the output signal. Indeed, the ideal on-off switch can never be realised, so that some intermediate values of output impedance will always be passed through in the course of transition.

Figure 5:
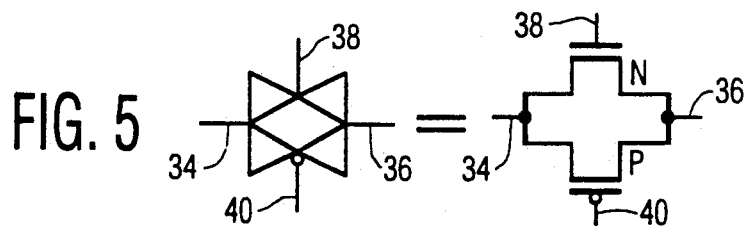
FIG. 5 defines the symbol for a transmission gate as used in FIGS. 6 and 7.
Figure 6:
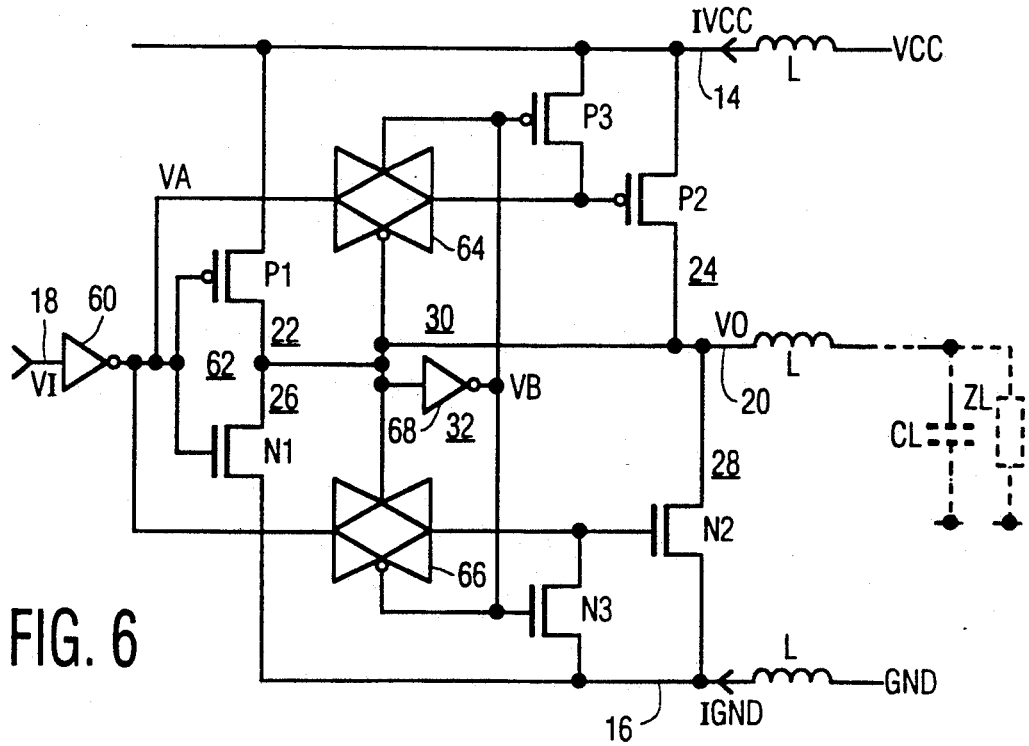
FIG. 6 shows in schematic form a first detailed embodiment of the driver circuit of FIG. 4.
Figure 7:
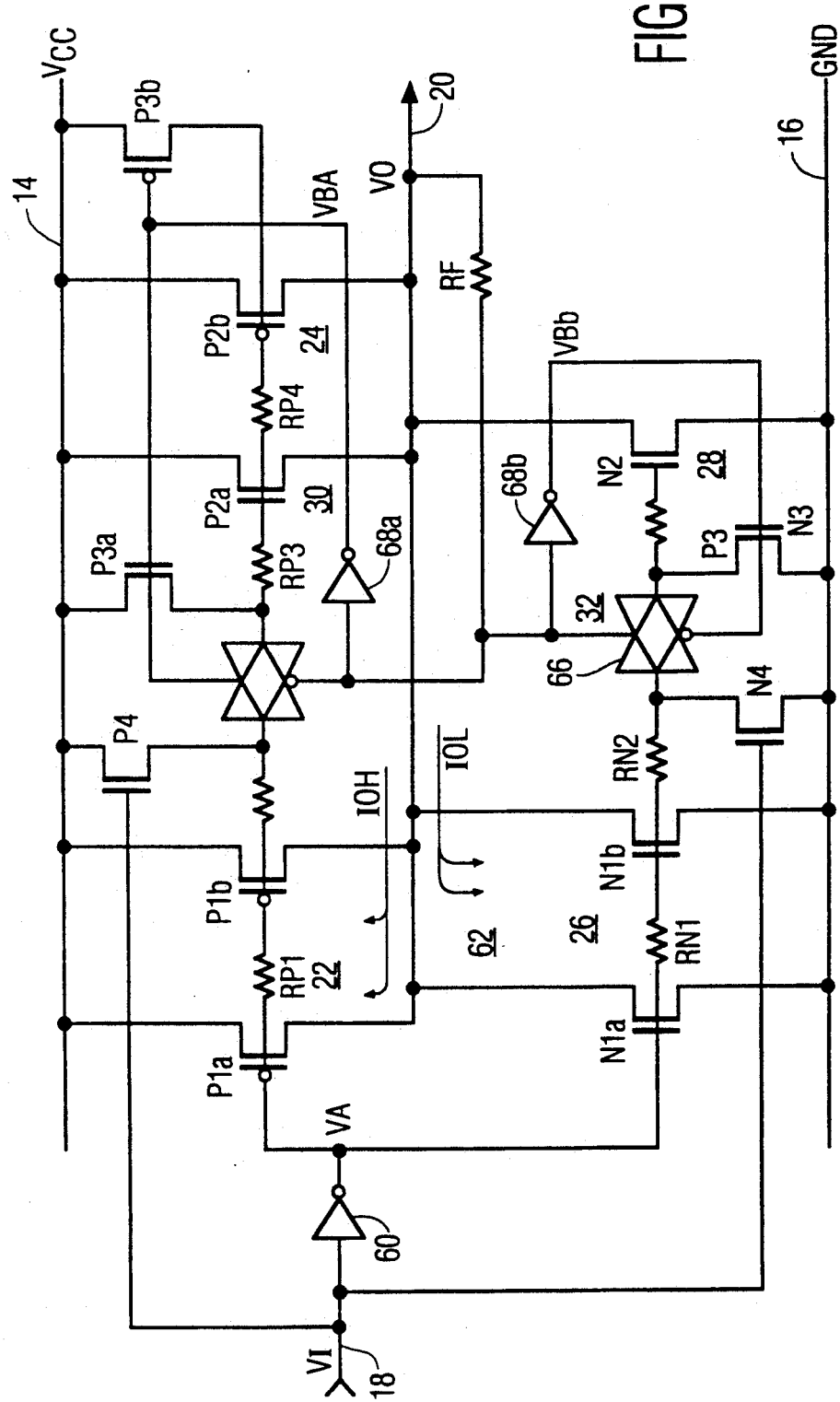
FIG. 7 shows in schematic form a second detailed embodiment of the driver circuit of FIG. 4.

FIG. 5 shows on the left a symbol for a transmission gate which is used in the embodiments of FIGS. 6 and 7. A CMOS circuit for a transmission gate is shown on the right hand side of FIG. 5. All transistors used in this embodiment are enhancement mode insulated gate field-effect transistors, such as MOS transistors. An n-channel transistor N and a p-channel transistor P are connected with their main current paths in parallel between two main terminals 34 and 36 of the transmission gate. The gates of N and P form complementary gating inputs 38 and 40 of the transmission gate respectively. Signals can be conducted (transmitted) in either direction between the terminals 34 and 36, or else blocked, depending on signals applied to the gating inputs 38 and 40 of the transmission gate. In general, complementary signals will be applied to the gating inputs 38 and 40. When input 38 is high and input 40 is low, both transistors N and P will be on, conducting signals bidirectionally between terminals 34 and 36. In the reverse situation, when input 38 is low and input 40 is high, both transistors N and P will be off, blocking the passage of signals between terminals 34 and 36. The gating inputs 38 and 40 of a transmission gate will be referred to herein as the N and P gating inputs respectively, with the P gating input 40 being marked by a circle in the symbol shown in FIG. 5.

FIG. 6 shows a first practical embodiment of the circuit of FIG. 4, constructed for the sake of example using MOS transistors. The reference signs used in FIGS. 6 and 7 correspond as far as possible with those used in FIG. 4. First and second high-side drive means 22 and 24 are formed by first and second p-channel transistors P1 and P2, respectively, connected between the supply line 14 (VCC) and the output line 20 (VO). First and second low-side drive means 26 and 28 are formed by first and second n-channel transistors N1 and N2, respectively, connected between the supply line 16 (GND) and the output line 20 (VO). The transistors P2 and N2 are constructed with wider channels than the transistors P1 and N1, so as to have lower on-resistances than those other transistors.

An inverter 60 has an input connected to the input line 18 (VI) and has an output (VA) connected directly to the gates of the high impedance transitors P1 and N1. The output (VA) of the input inverter 60 is also connected via a first transmission gate 64 to the gate of the low impedance p-channel transistor P2, and via a second transmission gate 66 to the gate of the low impedance n-channel transistor N2. The output line 20 (VO) is connected to the P gating input of the first transmission gate 64 and also to the N gating input of the second transmission gate 66. A further inverter 68 has an input also connected to the output line 20 (VO) and has an output (VB) connected to the N gating input of the first transmission gate 64 and also to the P gating input of the second transmission gate 66.

A p-channel clamping transistor P3 connects the supply line 14 (VCC) to the gate of the low impedance p-channel transistor P2. An n-channel clamping transistor N3 connects the supply line 16 (GND) to the gate of the low impedance n-channel transistor N2. The gates of the clamping transistors P3 and N3 are connected to the output (VB) of the further inverter 68.

The elements of the FIG. 6 circuit correspond closely to those in FIG. 4, except that the further inverter 68 forms part of the feedback devices both for high-side (30) and low-side (32). The complementary transistor pair P1/N1 forms a conventional CMOS inverter 62, so that by virtue of the input inverter 60, the driver circuit as a whole has a non-inverting function. Considering again the high-to-low transition illustrated in FIG. 2, curves (a) (VI) and (c) (VO), and bearing in mind the principles of operation already described with reference to FIG. 4, the operation of the driver circuit of FIG. 6 can be described as follows.

In the steady state before the input transition (A, FIG. 2), VI is high (VCC) so that VA at the output of the input inverter 60 is low (GND). The high impedance transistors P1 and N1 are on and off respectively, so that VO is high and VB at the output of the further inverter 68 is low. The first transmission gate 64 is therefore blocking, and the p-channel clamping transistor P3 is on, ensuring that the low-impedance p-channel transistor P2 is off. The second transmission gate 66 is conducting the low value of VA to the gate of low impedance transistor N2, which is therefore off. The n-channel clamping transistor N3 is also off.

Immediately following the input transition (B in FIG. 2), VI is low and VA goes high. This causes the high impedance p-channel transitor P1 to turn off and the corresponding n-channel transistor N1 to turn on, but the output signal VO remains high due to the line capacitance CL. The second transmission gate 66 remains conducting and VA (high) is applied to the gate of the low impedance n-channel transistor N2, turning it on. The n-channel transistors N1 and N2 therefore work in parallel to conduct respective portions of the large output current IO and thereby to begin the rapid discharging of the line capacitance CL, so that VO begins to fall towards GND.

A certain threshold value of VO is determined by the supply voltage VCC and the threshold voltages of the transistors in the second transmission gate 66 and in the further inverter 68. These threshold voltages can be set as desired by varying the dimensions of the transistors in a manner well known to those skilled in the art. As VO crosses this threshold, the state of the transmission gate 66 and the further inverter 68 will change so that the gate 66 becomes blocking and VB at the output of the inverter 68 becomes high. As a result, the low impedance transistor N2 can no longer be turned on by the signal VA, and furthermore the clamping transistor N3 gets turned on by VB and ensures rapid turn off of the low impedance transistor N2 before VO reaches GND. Thereafter, only the high impedance transistor N1 is driving the output line 20 (VO) (conducting the output current IO), so that VO settles without ringing to the desired value GND.

The first transmission gate 64 also changes state to become conducting as VO crosses the threshold. The low impedance p-channel transistor P2 therefore remains turned off throughout the high to low transition: initially because clamping transistor P3 is on and later because the high value of VA is conducted to the gate of transistor P2 by the first transmission gate 64. In response to a subsequent low-to TM high input transition, the desired output transition is effected by the high-side elements P1, P2, P3 and 64 in a manner complementary to that described above in relation to the low-side elements N1, N2, N3 and 66 during the high-to-low transition, with the direction of current reversed.

The signal values indicated in FIG. 2, curve (c), and FIG. 3, curves (c) and (d) represent the values of VO, IGND and IVCC in a typical circuit according to FIG. 6, when operating from a supply voltage VCC of 5 volts and driving a line capacitance CL of approximately 50 picofarads. The threshold-to-threshold propagation delay T is approximately 3 ns, and the output transition time is also approximately 3 ns.

The load circuit impedance ZL in the example presented in FIGS. 2 and 3 is susbstantially infinite (dc value). This is typical for example when the load circuit is a CMOS or mixed bipolar-CMOS (BiCMOS) circuit. Consequently the steady state values of IGND and IVCC are substantially zero. This will not be the case for all circuit technologies. For example a driver circuit for a TTL input may need to supply several milliamps through the output line 20 in the low steady state. The high impedance transistors P1 and N1 should in such a case have an on-resistance low enough to meet the current requirements of the load circuit represented by ZL.

The second practical embodiment illustrated in FIG. 7 is a modification of the embodiment of FIG. 6, as will be apparent to the reader skilled in the art. The same reference signs are used in FIG. 7 as in the earlier figures, to the extent possible, and the following description will be limited to the points of distinction between the two embodiments.

In the embodiment of FIG. 7, the first high-side drive means 22 formed in FIG. 6 by transistor P1 has been replaced with parallel transistors P1a and P1b. Similarly, the second high-side drive means 24 (transistor P2) has been replaced with transistors P2a and P2b, and the first low-side drive means 26 (transistor N1) has been replaced with transistors N1a and N1b. The second low-side drive means 28 remains a unitary transistor referenced N2.

The gates of the p-channel transistors P2a and P2b receive signal VA via the transmission gate 64 as before. Additionally, however, the gates of transistors P1b, P2a and P2b are separated from one another and from the transmission gate 64 by a chain of resistors RP1 to RP4 as shown in FIG. 7. Similarly, the gates of transistors N1a, N1b and N2 are separated from one another and from the transmission gate 66 by a chain of resistors RN1 to RN3. It should be noted that in modern CMOS-type circuit technologies the gates of the transistors are made of polysilicon instead of metal. In that case, the gates and resistors can be made conveniently using a single pattern of polysilicon and each gate will in itself form a distributed resistor. The discrete resistors shown in FIG. 7 are to this extent only approximations to the distributed resistances in a physical embodiment.

Each resistor RP1, RP2/RP3, RP4, RN1 and RN2/RN3 forms an RC delay element with the gate capacitance of a respective transistor. Therefore, in response to a high-to-low input transition, the transistors N1a, N1b and N2 are activated (turn on) sequentially, each following the preceding one after a short delay. Similarly, in the case of a low-to-high transition, the transistors P1a, P1b, P2a and P2b turn on sequentially, rather than simultaneously. The effect of turning on a plurality of parallel driver transistors sequentially rather than simultaneously is to reduce the instantaneous rate of change of current (dI/dt) flowing in the supply lines 14, 16 and the output line 20. This leads to a proportional reduction in the noise voltages induced in the inductances L of those lines. The resistor values are chosen to make the R-C delays smaller than the transition time. For example, the circuit of FIG. 7 may be used to drive a line capacitance of 150 picofarads with a typical transition time of 10 ns, while the R-C delays are such that all of the transistors P1a, P1b, P2a and P2b turn on within two or three nanoseconds.

When the threshold of the output signal VO is crossed, it is desirable that the transistors P2a and P2b should turn off without such a delay. The clamping transistor P3 is for this purpose divided into two clamping transistors P3a and P3b. The transistor P2b is turned off by transistor P3b acting directly on its gate, while the transistor P2a is turned off quickly by transistors P3a and P3b acting in parallel via resistors RP3 and RP4 respectively.

The embodiment of FIG. 7 can be made suitable for driving a TTL-compatible load circuit (ZL). In such an application, the impedances of the transistors N1a and N1b which form the first low-side drive means 26 will need to be made low enough that a steady state output current IOL (VO low) of 2 or more milliamps can be supplied. Other applications, for example in bus driving, may also require substantial steady state currents in one or both states. Additional clamping transistors P4 and N4 receive the input signal VI and act on the gates of the transistors P1b and N1b respectively. Since the steady state output currents IOL (VO low) and IOH (VO high) may be substantial, these clamping transistors P4 and N4 act via the resistors RP2 and RN2 respectively so that the transistor P1b or N1b turns off rapidly in the event of a transition, but not exactly at the same time as the corresponding transistor P1a or N1a respectively. In this manner, dI/dt noise may be further reduced.

A further point of difference from the embodiment of FIG. 6 is that the output line 20 is connected to the gating inputs of the transmission gates via an electrostatic discharge (ESD) protection device, including a resistor RF. The resistance of the resistor RF is low, for example 800 ohms, and may be regarded as a short circuit for the purposes of this description.

A yet further point of difference is that the output signal VO fed back via the resistor RF is supplied in parallel to the inputs of two inverters 68a and 68b, in place of the single inverter 68 provided in FIG. 6. The output (VBa) of inverter 68a is connected to the N gating input of the first transmission gate 64 and to the gates of the p-channel clamping transistors P3a and P3b. The output (VBb) of inverter 68b is connected to the P gating input of the second transmission gate 66 and to the gate of the n-channel clamping transistor N3. The sequence of operation of the circuit is the same as described above with reference to FIG. 6, except that the threshold for deactivation of the second high-side drive means 24 (P2a/P2b) in the course of a low-to-high transition and the threshold for deactivation of the second low-side drive means 28 (N2) in the course of a high-to-low transition can be made to be different by using different transistor dimensions in the transmission gates 64 and 66 and in the two inverters 68a and 68b.

In particular, the TTL-compatible load circuit being driven will typically have input threshold voltages VIH=2.4 volts (minimum) and VIL=0.4 volts (maximum). In that case, it is desirable that the threshold of inverter 68a should be at least 2.4 volts above GND, while the threshold of inverter 68b should be no more than 0.4 volts above GND, if possible. Further variations may be apparent to the skilled reader.

We claim:

1. A driver circuit having an input, an output and a first supply terminal, for causing a desired transition in a signal at the output in response to a corresponding transition in a signal at the input, comprising:

first drive means connected between the output and the first supply terminal for receiving the input signal and for, in response to the transition in the input signal, conducting a first output current contributing to the desired output transition; a transmission gate having a signal input, a signal output and a gating input, the signal input being coupled to the driver circuit input, the gating input being coupled to the output of the driver circuit; and second drive means also connected between the output and the first supply terminal for receiving the input signal via the signal output of the transmission gate, and for, in response to the input signal transition, conducting a second output current contributing in parallel with the first output current to the desired output signal transition, the transmission gate being operative to interrupt the receiving of the input signal by the second drive means in response to the output signal crossing a threshold value in the course of the output signal transition.

2. A driver circuit as claimed in claim 1, wherein:

the second drive means comprises a transistor having its main current path connected between the first supply terminal and the output of the driver circuit; and clamping means for turning off the transistor in response to the output signal crossing said threshold value.

3. A driver circuit as claimed in claim 2, wherein at least one of the first and second drive means is activated with a small delay so as to reduce the rate of change of the respective output current at the start of the output signal transition.

4. A driver circuit as claimed in claim 2 wherein the second drive means comprises an insulated gate field-effect transistor.

5. A driver circuit as claimed in claim 2 wherein the first and second drive means comprise insulated gate field-effect transistors of different channel dimensions.

6. The driver circuit of claim 2, wherein the second drive means receives the input signal via the first drive means and wherein the first drive means includes delay means for delaying, for a predetermined period of time after the output signal transition, the interruption of receiving of the input signal by the second drive means.

7. The driver circuit as claimed in claim 1, wherein at least one of the first and second drive means is activated with a small delay so as to reduce the rate of change of the respective output current at the start of the output signal transition.

8. A driver circuit as claimed in claim 1 wherein the second drive means is of low impedance relative to the first drive means.

9. The driver circuit of claim 1, wherein the second drive means receives the input signal via the first drive means and wherein the first drive means includes delay means for delaying, for a predetermined period of time after the output signal transition, the interruption of receiving of the input signal by the second drive means.

10. A driver circuit as claimed in claim 1 wherein the circuit also causes a complementary transition of the output signal in a direction opposite to that of the first mentioned output signal transition, in response to a corresponding complementary transition in the signal at the input, the circuit further comprising:

a second supply terminal;

a first complementary drive means connected between the output and the second supply terminal for receiving the input signal and for, in response to the complementary input signal transition, conducting a first complementary output current contributing to the complementary output signal transition;

a further transmission gate having a signal input, a signal output and a gating input, the signal input being coupled to the driver circuit input, the gating input being coupled to the output of the driver circuit, and second complementary drive means also connected between the output and the second supply terminal, for receiving the input signal via the signal output of the further transmission gate, for, response to the complementary transition in the input signal, conducting a second complementary output current contributing in parallel with the first complementary output current to the complementary output signal transition, the further transmission gate being operative to interrupt the receiving of the input signal by the second complementary drive means, in response to the output signal crossing the threshold value in the course of the complementary output signal transition.

11. A driver circuit as claimed in claim 10, wherein each of the transmission gate and the further transmission gate has a complementary gating input both coupled via an inverter to the output of the driver circuit and wherein the inverter is provided for coupling the driver circuit output to the complementary gating inputs of both the transmission gates in common.

12. A driver circuit as claimed in claim 10, wherein each of the transmission gate and the further transmission gate has a complementary gating input and wherein a first inverter is provided to couple the output of the driver circuit to the complementary gating input of the transmission gate and a second inverter is provided to couple the output of the driver circuit to the complementary gating input of the further transmission gate.

13. A driver circuit as claimed in claim 10 wherein the driver circuit is constructed using complementary insulated gate transistors in a CMOS circuit configuration.

14. A driver circuit as claimed in claim 10 wherein the second drive means is of low impedance relative to the corresponding first drive means.

15. The driver circuit of claim 10, wherein the second complementary drive means receives the input signal via the first complementary drive means and wherein the first complementary drive means includes delay means for delaying, for a predetermined period of time after the output transition, the interruption of receiving of the input signal by the second complementary driving means.

* * * * *